(12) United States Patent
Joshi et al.

(10) Patent No.: US 8,762,087 B2
(45) Date of Patent: Jun. 24, 2014

(54) ACCURATE INTEGRATED CIRCUIT PERFORMANCE PREDICTION USING ON-BOARD SENSORS

(75) Inventors: Mayur Joshi, San Jose, CA (US); Anthony M. Hill, Dallas, TX (US); Jose L. Flores, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1534 days.

(21) Appl. No.: 11/839,826

(22) Filed: Aug. 16, 2007

(65) Prior Publication Data

US 2008/0120065 A1 May 22, 2008

Related U.S. Application Data

(60) Provisional application No. 60/866,244, filed on Nov. 17, 2006.

(51) Int. Cl.
*G01R 23/02* (2006.01)

(52) U.S. Cl.
USPC .......................................................... 702/75

(58) Field of Classification Search
USPC ........... 702/57–60, 64, 69, 74, 75, 78, 79, 80, 702/82, 99, 106, 117, 118, 120, 127, 130, 702/179, 182–185, 188, 193; 331/57; 327/39; 703/15; 438/14
See application file for complete search history.

(56) References Cited

U.S. PATENT DOCUMENTS

| | | | |
|---|---|---|---|
| 5,790,491 A * | 8/1998 | Jaquette et al. | 369/47.53 |
| 6,105,153 A * | 8/2000 | Yamada | 714/724 |
| 6,114,880 A * | 9/2000 | Buer et al. | 327/39 |
| 6,216,099 B1 * | 4/2001 | Fang et al. | 703/15 |
| 6,869,808 B2 * | 3/2005 | Yonezawa et al. | 438/14 |
| 2004/0263265 A1* | 12/2004 | Allen et al. | 331/57 |
| 2006/0263913 A1* | 11/2006 | Marshall | 438/14 |

* cited by examiner

*Primary Examiner* — Mohamed Charioui
(74) *Attorney, Agent, or Firm* — Robert D. Marshall, Jr.; W. James Brady; Frederick J. Telecky, Jr.

(57) ABSTRACT

This invention places plural ring oscillators on a semiconductor chip during manufacture. The respective oscillation frequencies of these ring oscillators are measured. The semiconductor chip is assigned a grade dependent upon the measured frequencies. The ring oscillators are disposed proximate to critical paths on the semiconductor chip and employ circuit types to model the critical path operation under as many the manufacturing variations as possible. A linearly fitted model of ring oscillator frequencies to critical path delays is constructed during characterization after manufacture.

11 Claims, 8 Drawing Sheets

| RING OSCILLATOR GATE PARAMETERS | | |
|---|---|---|
| INVERTER | NAND2 | NOR2 |
| STANDARD VT (SVT) | STANDARD VT (SVT) | STANDARD VT (SVT) |
| HIGH VT (HVT) | HIGH VT (HVT) | HIGH VT (HVT) |
| SIZE A | SIZE A | SIZE A |
| SIZE B | SIZE B | SIZE B |

ACCURATE INTEGRATED CIRCUIT PERFORMANCE PREDICTION USING ON-BOARD SENSORS

CLAIM OF PRIORITY

This application claims priority under 35 U.S.C. 119(e)(1) to U.S. Provisional Application No. 60/866,244 filed Nov. 17, 2006.

TECHNICAL FIELD OF THE INVENTION

The technical field of this invention is integrated circuit design modeling.

BACKGROUND OF THE INVENTION

Design methods for current digital electronics systems employ sophisticated modeling techniques to analyze every aspect of device behavior. The silicon die (chips) on which integrated circuits reside have a distribution in their maximum obtainable performance due to unavoidable manufacturing variations. These chips are also expected to operate under different supply voltages, temperatures and performance requirements. The task of accurately predicting the performance of a chip under these varying conditions is critical in a wide range of applications. Consider the following examples in which chip performance predictions can be applied to address special needs.

EXAMPLE 1

Chips having higher performance due to manufacturing variations tend to use more power. With data on the performance of a chip available, the supply voltage for such chips can be adapted to just meet the performance requirements. This reduces the maximum power consumption for the part. Texas Instruments has designated this approach as SmartReflex. This supply voltage adaptation may be done in field, during chip power-up or during testing after manufacture.

EXAMPLE 2

Chips may be required to operate at different performance levels at different times. In such cases the supply voltage can be adapted to reduce power consumption.

EXAMPLE 3

Chips can be binned according to performance. The higher performance chips can be sold at a premium for applications that require higher performance.

During manufacturing there are random variations in the performance of transistors. These variations affect different types of logic cells to a different extent. Two basic measurements have been used in the prior art to evaluate transistor performance. FIG. 1 illustrates definition of the first measurements: transistor on current IDP(ON) 103 for P-channel transistor 101; and transistor on current IDN(ON) 104 for N-channel transistor 102. These currents correspond to transistor strength. Transistor strength influences the ability of the transistors to charge and discharge node capacitance and hence the circuit speed. FIG. 2 illustrates a ring oscillator. Such ring oscillators are widely used to indicate basic gate delay through frequency measurement. The enable pin Osc_En 105 stops the oscillator when low and enables the oscillator when high. The oscillator output Osc_Out 106 produces a signal whose frequency is determined by the total propagation delay of individual inverters 107.

A common solution to predicting performance is to place several ring oscillators (ROs) in different locations on each chip. These ROs identify the worse case performance of the full range of gates on the chip. The worst of multiple ROs indicates the performance of the chip. This simple approach, when examined statistically for accuracy of the prediction, fails to enable confident decisions on performance.

SUMMARY OF THE INVENTION

In the integrated circuit performance prediction method of this invention, cells on a given chip are selected that capture as many of the manufacturing variations as possible. Ring oscillators (ROs) are built out of these cells. The delays of the ROs are then combined using a linearly fitted model to predict the delay of the critical paths in the chip. The linearly fitted model is constructed during characterization after the chip is manufactured. This model takes the various variations in the ROs into account in determining the extent to which they affect the critical path. This model predicts chip power, hot spot temperature and other thermal effects.

BRIEF DESCRIPTION OF THE DRAWINGS

These and other aspects of this invention are illustrated in the drawings, in which.

DETAILED DESCRIPTION OF PREFERRED EMBODIMENTS

Silicon chip manufacture produces built-in random variations in the performance of transistors. These variations affect different types of logic cells in varying degrees.

This invention uses a selectable set of ring oscillators (ROs) to capture as many of the variations as possible. These ROs are chosen to identify the worse case performance of the full range of gates on the chip. The ROs chosen employ a range of cells including NANDs, NORs and inverters that utilize transistors having two possible voltage threshold values standard voltage threshold (SVT) and high voltage threshold (HVT). These cells do not have to exhibit worse case performance among all logical gates. Their performance need only be predictive of some of the random variations observed in the critical paths of the chip.

The respective operating frequencies of these ROs are measured. This invention reduces the corresponding periods of the oscillators to equivalent gate delays values $D(RO_i)$. This invention combines the resulting gate delay values using a linearly fitted model to predict the delay of critical paths in the chip. This invention constructs the linearly fitted model during characterization after the chip is manufactured. This invention determines the delay D(CP) of the worst of several critical paths.

First, the delay values for a suitably large number of ROs of several types from many individual die (chips) are measured and computed. Equation (1) shows how this information can then be fitted to a linear model.

$$D(CP) = \sum_i a_i D(RO_i) \quad (1)$$

where: D(CP) is the delay of the worst of the critical paths; $a_i$ is a linear scaling coefficient of the i-th RO; and $D(RO_i)$ is the delay value of the i-th RO. The linear scaling coefficient $a_i$ may be viewed as weighting factors affecting the contribution of an individual RO delay value to the expected worst case path delay D(CP).

Equation (2) shows a second-order linear model which may also be used to obtain better accuracy:

$$D(CP) = \sum_i a_i D(RO_i) + \sum_i \sum_j (b_{i,j} D(RO_i) D(RO_j)) \quad (2)$$

where: $b_{i,j}$ is a linear scaling coefficient similar to $a_i$ of the i-th and the j-th RO. Both the first order model and the second order model take into account the variations in the ROs to determine the extent to which they affect the critical path. Generally any path on a chip uses structures similar to those used in the ROs. By replicating these structures in the ROs, it is possible to capture their variation. The delay value contributions of each of these structures to the total path delay yield different scaling coefficients ($a_i$ and $b_{i,j}$).

Figure 1:
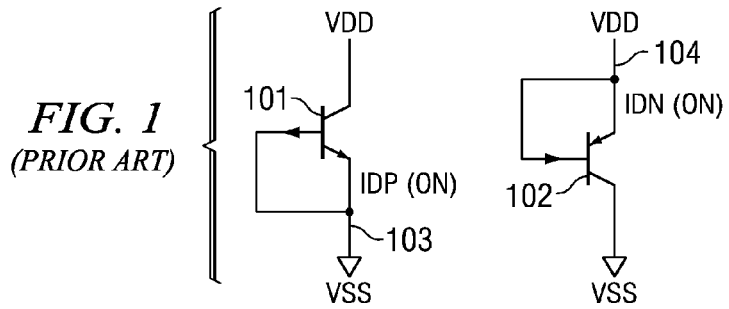
FIG. 1 illustrates two basic measurements used to determine transistor current drive strength (Prior Art)
Figure 2:
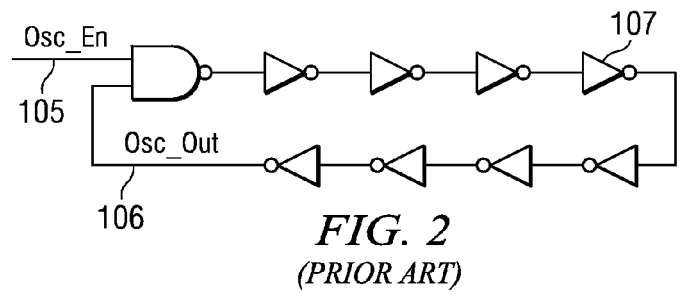
FIG. 2 illustrates a ring oscillator configuration allowing for frequency measurements relating to gate propagation delay and logic speed (Prior Art)
Figure 3:
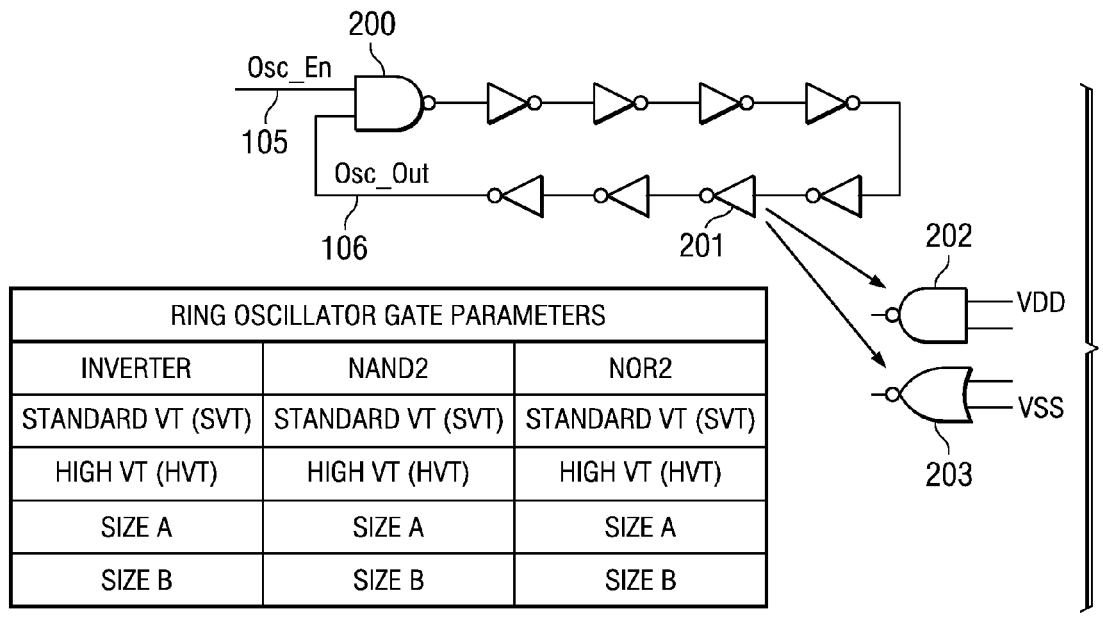
FIG. 3 illustrates the logic diagram of a generic ring oscillator configuration used in this invention and an accompanying table showing that all oscillator elements stages may be replaced individually by three combinations and permutations of gate types and gate parameters found to strongly influence model accuracy.

FIG. 3 illustrates the logic diagram of the generic ring oscillator configuration used in this invention. The accompanying table indicates several combinations and permutations of gate parameters which strongly influence model accuracy. Each ring oscillator is made up of only one gate type for all nine stages with one exception. An all-inverter ring oscillator includes a 2-input NAND 200 to input the enable signal Osc_En 105. The individual stages 201 may be 2-input NAND gates 202 or 2-input NOR gates 203.

Figure 4:
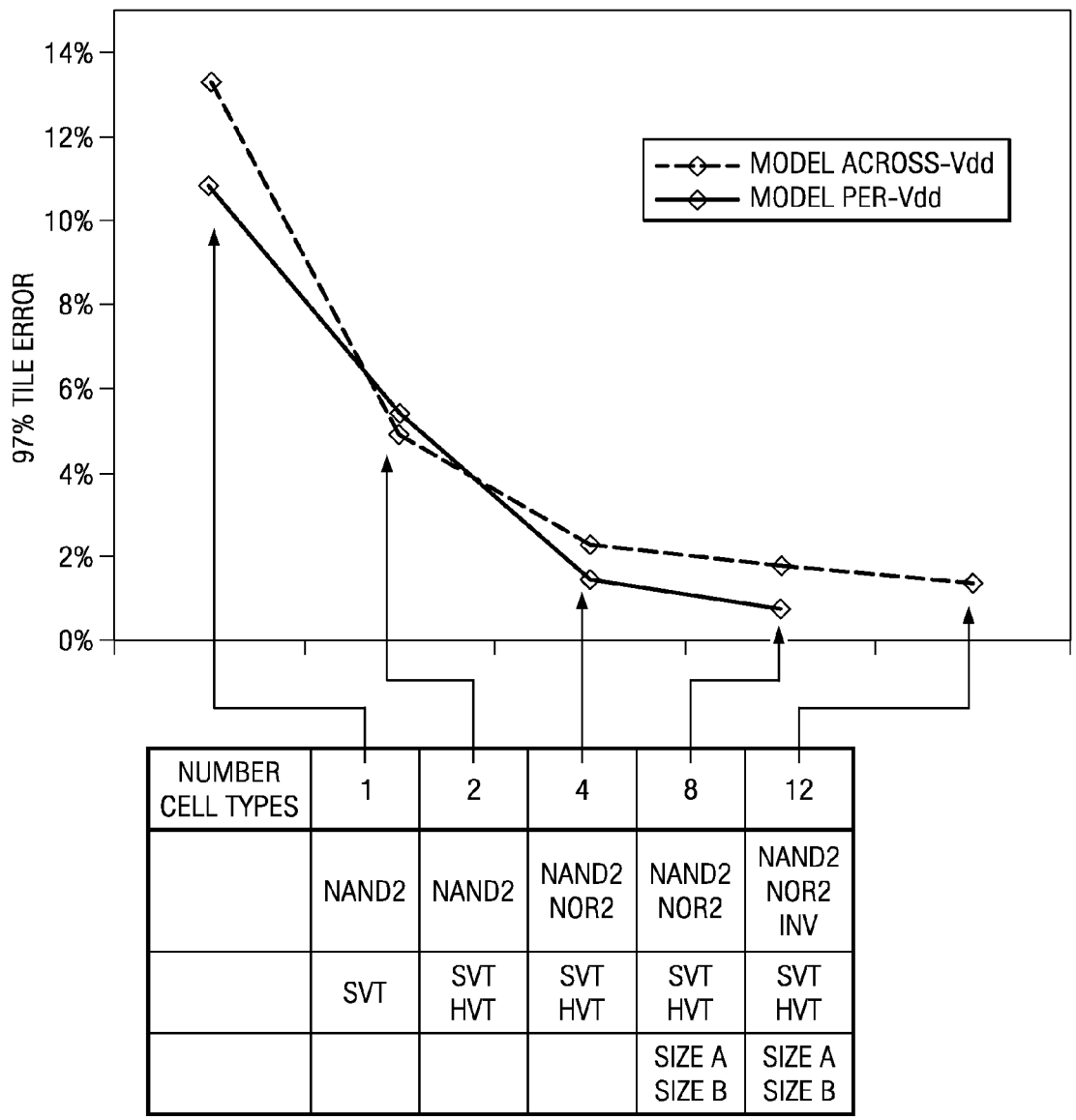
FIG. 4 illustrates curves of accuracy of prediction for ninety seventh percentile error for critical path delay D(CP) for increasingly complex combinations of RO cells included in the linear regression.

FIG. 4 illustrates a plot of experimental results using the linear regression approach of the invention. The vertical axis is the ninety-seventh percentile worst error in predicting performance of several critical paths using the delay values of several different ring oscillator combinations. The horizontal axis indicates the types of different ROs used. The extreme left point includes only one RO type. Moving along the X axis includes increasing combinations of ROs and permutations of parameters. As shown in FIG. 4 these additional inputs provide improving predictability.

The ROs for a practical embodiment cannot have every possible structure used in the critical paths on the chip. In addition the critical path may be at a different temperature and different voltage due to IR drop heating effects than the ROs. There might be consistent processing differences between the critical paths and the ROs because of the surrounding structures. The object of this invention is to automatically adopt a phenomenological model reflecting these differences without the need for explicit margins.

The model could include parameters that could extend beyond ring oscillators. They could include:
1. Transistor and interconnect parameters measurements;
2. Voltage, temperature and other environmental parameters. For example different critical paths may be important at different voltages;
3. Processing equipment used during manufacturing or testing. Different lithography tools may exhibit different correlations between the ROs and the critical path; and
4. Current application being run on the chip. Some applications may only exercise only a few of the critical paths on the chip or may cause a smaller IR drop or temperature. This may result is a different maximum performance capability by the chip based upon the current application.

Model construction can be piece-wise using a different model for each value or range of values of particular parameter. A higher order model than equations (1) and (2) could be used.

Multiple copies of the measurement structures can be distributed around the chip to capture variations across the chip. The measured parameters from each of these structures will be a separate fitting parameter. Some of these parameters may not improve the predictability of the model significantly. Those parameters will be identified and dropped from the model. These parameters will no longer have to be measured during routine testing after manufacturing saving test time.

Detailed descriptions of the tasks involved in linear regression modeling for a specific chip design are illustrated in FIGS. 5 to 10. These tasks are:
1. Identify RO designs that add significant terms in the regression equation;
2. Choose and store the optimum model;
3. Describe detail flow for manufacturing test leading to branding chip according to its performance (E-Fuse brand);
4. Describe detail flow for manufacturing test leading to binning chips according to their performance;
5. Detail design of RO cells coupled to test controller for RO testing; and
6. Describe and implement chip layout incorporating RO combinations coupled to test controllers at various locations on chip.

Figure 5:
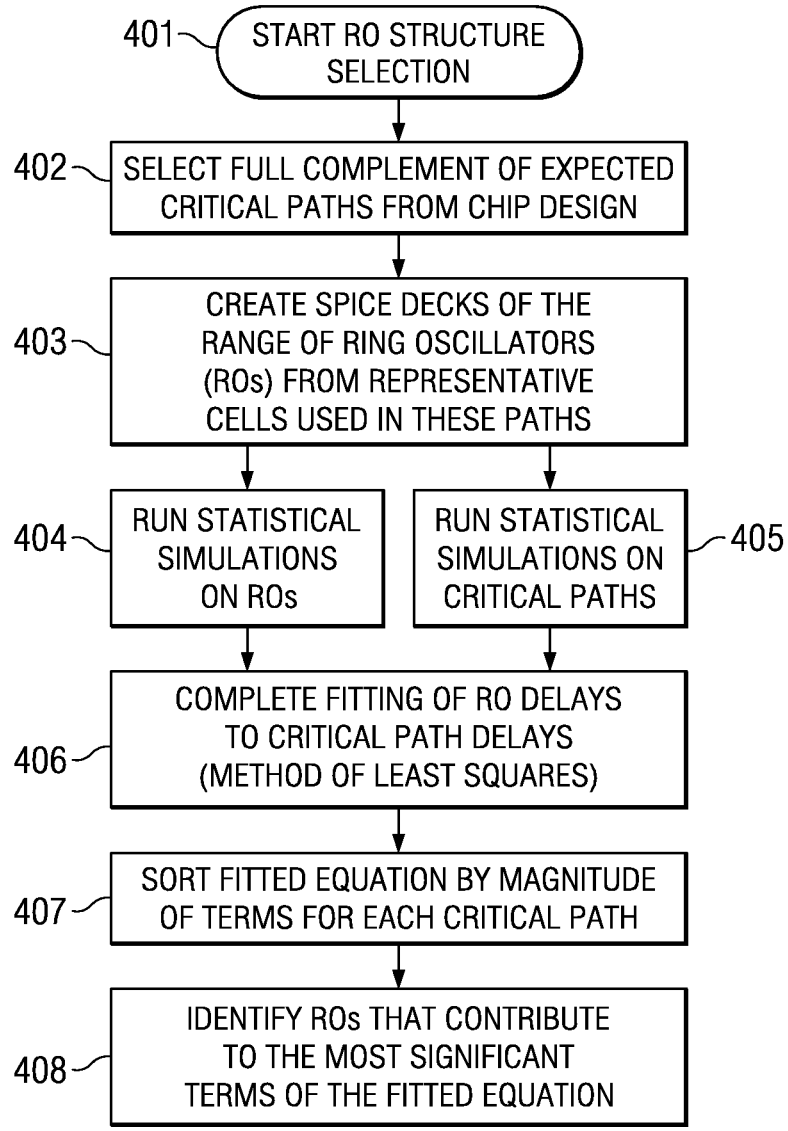
FIG. 5 illustrates a flow chart of a method for selection of the permutations and combinations of RO cells that contribute most significantly to the fitting of ring oscillator delay values to critical path delays.

FIG. 5 is a flow chart of this invention for selecting RO structures. Step 401 starts the RO selection process. Step 402 identifies the full complement of expected critical paths on the chip. This step includes making a collection of all likely critical paths and close to critical paths on the chip. Step 403 identifies the combinational logic cells and the critical path timing arcs in each cell that appear in the set of paths identified in step 402. Logic cell timing arcs are the transition at one input of a cell while the other inputs are held at particular logic levels causing a transition at an output.

Step 403 makes RO SPICE decks out of these cells in the appropriate configurations with the other inputs of the cells tied-off according to the identified timing arcs. If the cells arcs are non-inverting one inverter (preferably one from the set of identified cells) may be added in the RO loop. The linear regression technique automatically compensates for this.

Step 404 simulates RO and analyzes the frequency or delay across a range of statistical vectors. Each statistical vector represents a transistor variation in the range of possible manufacturing variations. Statistical SPICE models are supplied by the chip manufacturer.

Step 405 simulates the propagation delays of critical paths similar to those for ROs in step 404.

Step 406 performs a least squares fit using RO delays as the fitting functions to the critical path delay to form terms for linear regression. The fitting can be done to either first or second order polynomials of the RO delays depending on which method fits the critical path delays with minimum errors.

Step 407 takes each term of the fitted polynomial and sorts it by significance or maximum contribution to the delay of the critical paths over the statistical vectors run.

Step 408 identifies the ROs that contribute to the most significant terms of the fitted equation. This can be done in two ways. Step 408 could determine how many ROs can be accommodated on the chip and choose that many of the most significant ROs. Step 408 could determine a cut-off significance and only keep ROs that contribute to terms with larger significance than this limit.

Figure 6:
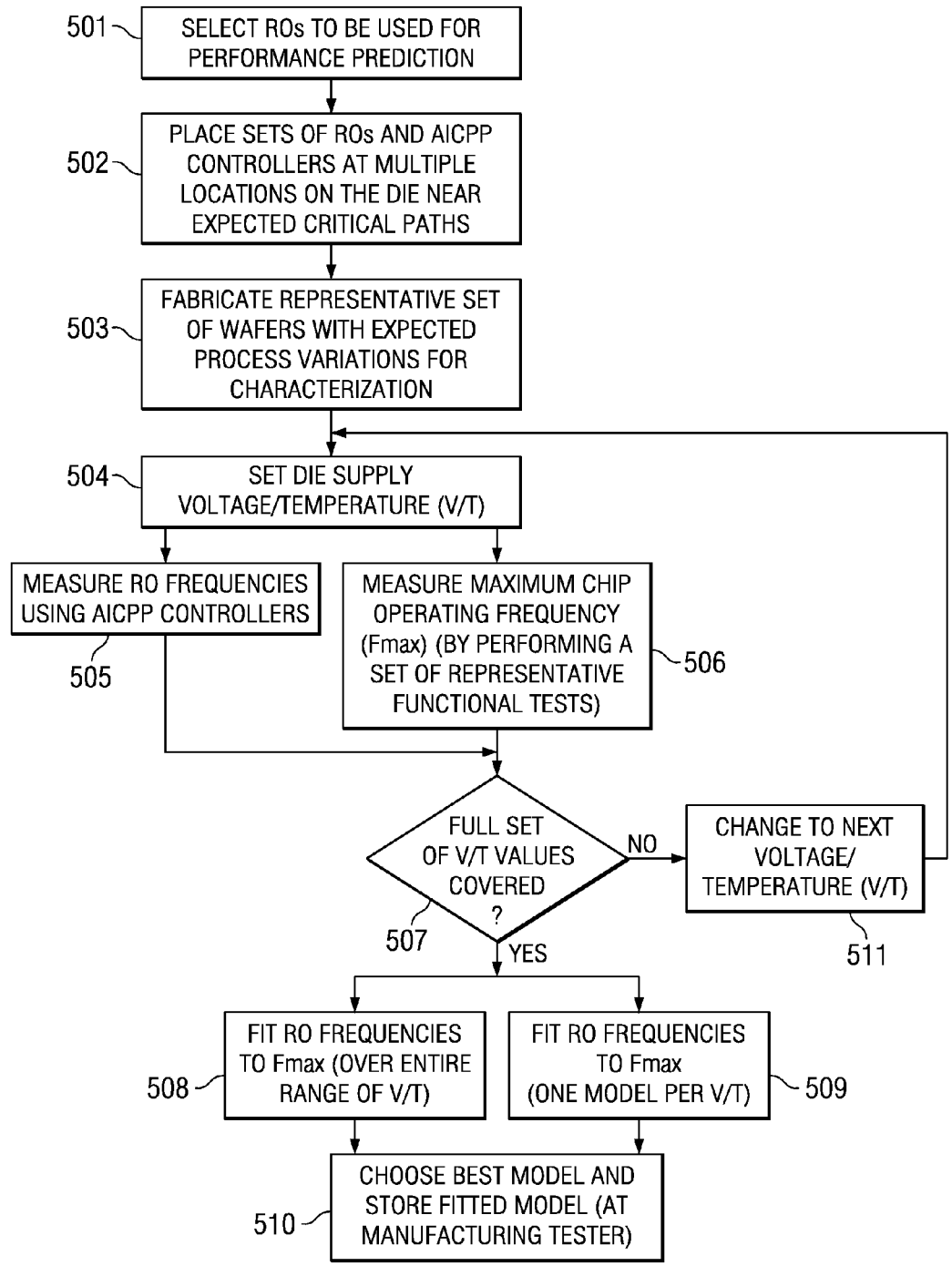
FIG. 6 illustrates a flow diagram of a method for characterizing a selected set of ring oscillators integrated with a chip design.

FIG. 6 illustrates the steps for selecting ROs and completing the linear regression model. Step 501 lists RO types to be used in model based on the method illustrates in FIG. 5. Step 502 completes the physical design and layout of RO cells and controllers integrated into chip with JTAG boundary scan connections. Step 502 puts sets of RO cells close to critical areas of the chip. Step 503 fabricates a representative set of wafers with expected process variations for characterization. These wafers are fabricated with deliberate manufacturing variations representing the range of variations expected during manufacture of product to be shipped to customers.

Step 504 mounts either the manufactured die or a packaged chip on a tester. This tester sets a die supply voltage and temperature to one of the values within its operating range. Step 505 measures RO frequencies for all ROs on the chip using test controllers. Step 506 performs a set of functional tests that normally measure the maximum operation frequency of the chip. The clock frequency of the chip is increased until one of these tests fail. This measures the maximum chip operating frequency ($F_{max}$).

Step 507 tests to determine if a full set of voltage/temperature (V/T) values has been considered. The device performance changes with voltage and temperature. Thus these tests are run for the entire range of voltage and temperature values. If step 507 results in NO, then the method goes to step 511. Step 511 changes to the next voltage/temperature value and repeats the tests of steps 505 and 506. If step 507 results in YES, then the method proceeds to steps 508 and 509.

Step 508 fits the RO frequencies to $F_{max}$ over entire range of voltages and temperatures using linear regression similar to step 406. The fitted expression obtain in this step might differ from that in step 406 since the real manufacturing variations might be different from those in the SPICE model or the actual critical paths might be different that expected. Step 509 fits the RO frequencies to $F_{max}$ for one model per V/T using linear regression. Step 510 chooses the best model. The per voltage/temperature value model should give better fit or lower error as compared to the single model for all voltage and temperature values. However the per voltage/temperature value model is more complex to compute. Hence there is tradeoff between the two. Depending on the resources and amount of error reduction observed in the per voltage/temperature value model, step 510 chooses one of those two for use during manufacturing.

A first application of this invention determines minimum supply voltage $V_{DD}$ for a desired frequency of operation. This application is used when it is desirable to sell parts with the same performance but reduce the power consumption of the parts whenever possible.

Figure 7:
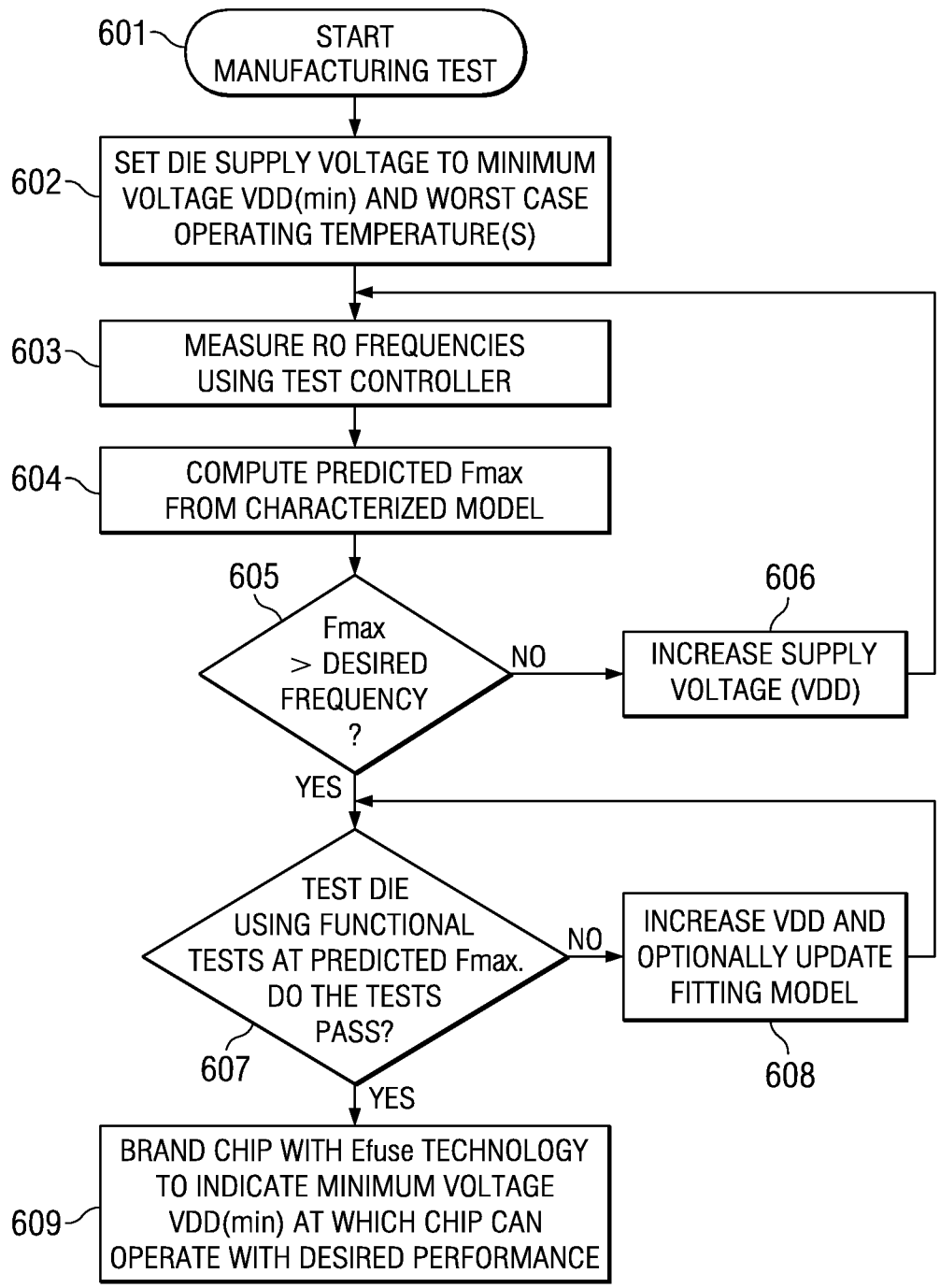
FIG. 7 illustrates a flow diagram a manufacturing process identifying the minimum supply voltage for which a given performance can be achieved.

FIG. 7 illustrates the steps to determine the minimum supply voltage $V_{DD}$ for a desired frequency of operation. Step 601 starts the manufacturing test at an initial desired frequency of operation. Step 602 set the die supply voltage to minimum voltage $V_{DD}$(min) and set the temperature to the worst case operation temperature. There may be more than one worst case operation temperature depending on various factors. If so, then this test is performed for each of the possible worst case operation temperatures. Step 603 measures the RO frequencies. Step 604 computes the maximum frequency of operation $F_{max}$ using the selected model and the measured RO delays.

Step 605 determines if $F_{max}$ exceeds desired frequency. If step 605 results in No, flow proceeds to step 606. Step 606 increases the supply voltage $V_{DD}$ and returns to step 603. This repeats the measurement of step 603 and the calculation of step 604. Note that FIG. 7 illustrates a linear search algorithm starting with the minimum $V_{DD}$. A more sophistical algorithm for example binary search could be used to speed up testing.

If step 606 results in YES, flow proceeds to step 607. Step 607 runs the usual functional test to determine that the predicted minimum $V_{DD}$ indeed results in circuit operation at the desired frequency $F_{max}$. Do the tests pass with the chip clock frequency set to $F_{max}$? If step 607 results in NO, then flow proceeds to step 608. Step 608 increases the supply voltage $V_{DD}$ and repeats step 607. Step 607 may be optionally update the model with a new fit of the measured RO delays to the observed $F_{max}$ value. This would allow capturing of drift in the correlation between ROs and chip $F_{max}$ due to changes in manufacturing over time.

If step 607 results in YES, then flow proceeds to step 609. Step 609 brands the chip with Efuse technology (write once memory) to indicate minimum voltage of operation $V_{DD}$ (min) This information can be read later for confirmation, A second application bins chips into appropriate performance bins. This application is used when reducing the power dissipation of the parts is not critical but identifying or binning parts by performance at a fixed supply voltage is important.

Figure 8:
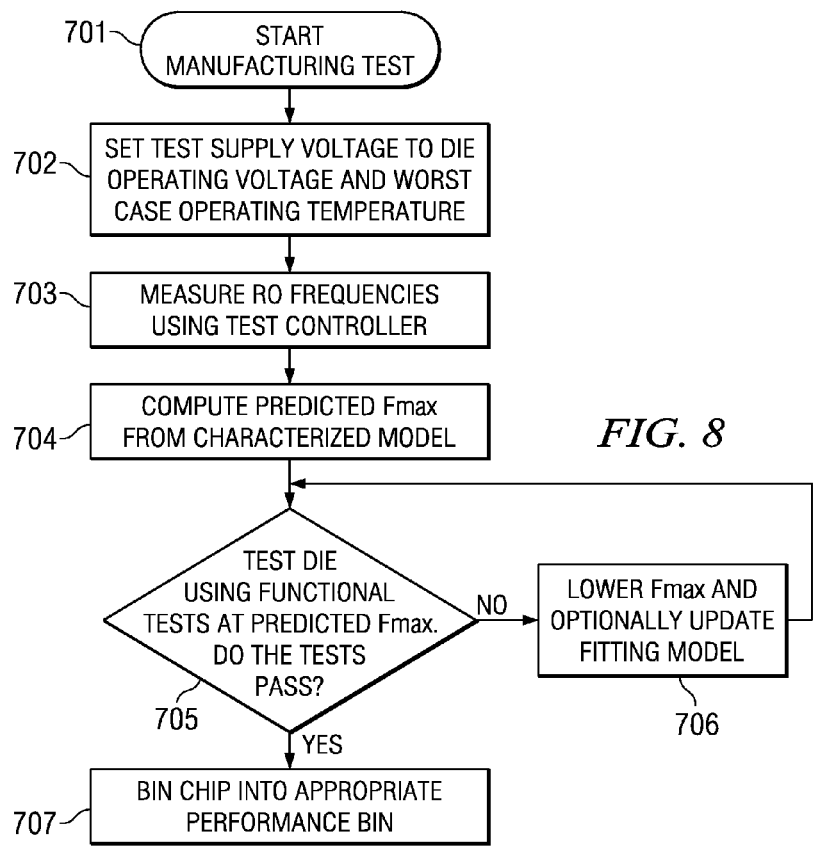
FIG. 8 illustrates a flow diagram of a manufacturing process for binning chips into performance levels.

FIG. 8 illustrates the steps for binning chips into appropriate performance bins. Step 701 starts the manufacturing test. Step 702 sets the test supply voltage to die operating voltage and sets the temperature to the worst case operating temperature. Step 703 measures the RO frequencies using the test controller. Step 704 computes the maximum operating frequency $F_{max}$ from the measured RO frequencies using the model.

Step 705 runs the usual functional test to determine whether that the chip indeed can operate at the determined $F_{max}$. Do the tests pass with the chip clock frequency set to $F_{max}$? If step 705 results in No, then the process proceeds to step 706. Step 706 lowers the maximum frequency $F_{max}$. Flow proceeds to repeat step 705. Step 706 optionally updates the models to account for the new lower $F_{max}$.

If step 705 results in YES, then step 707 places the tested chip into an appropriate performance bin.

Figure 9:
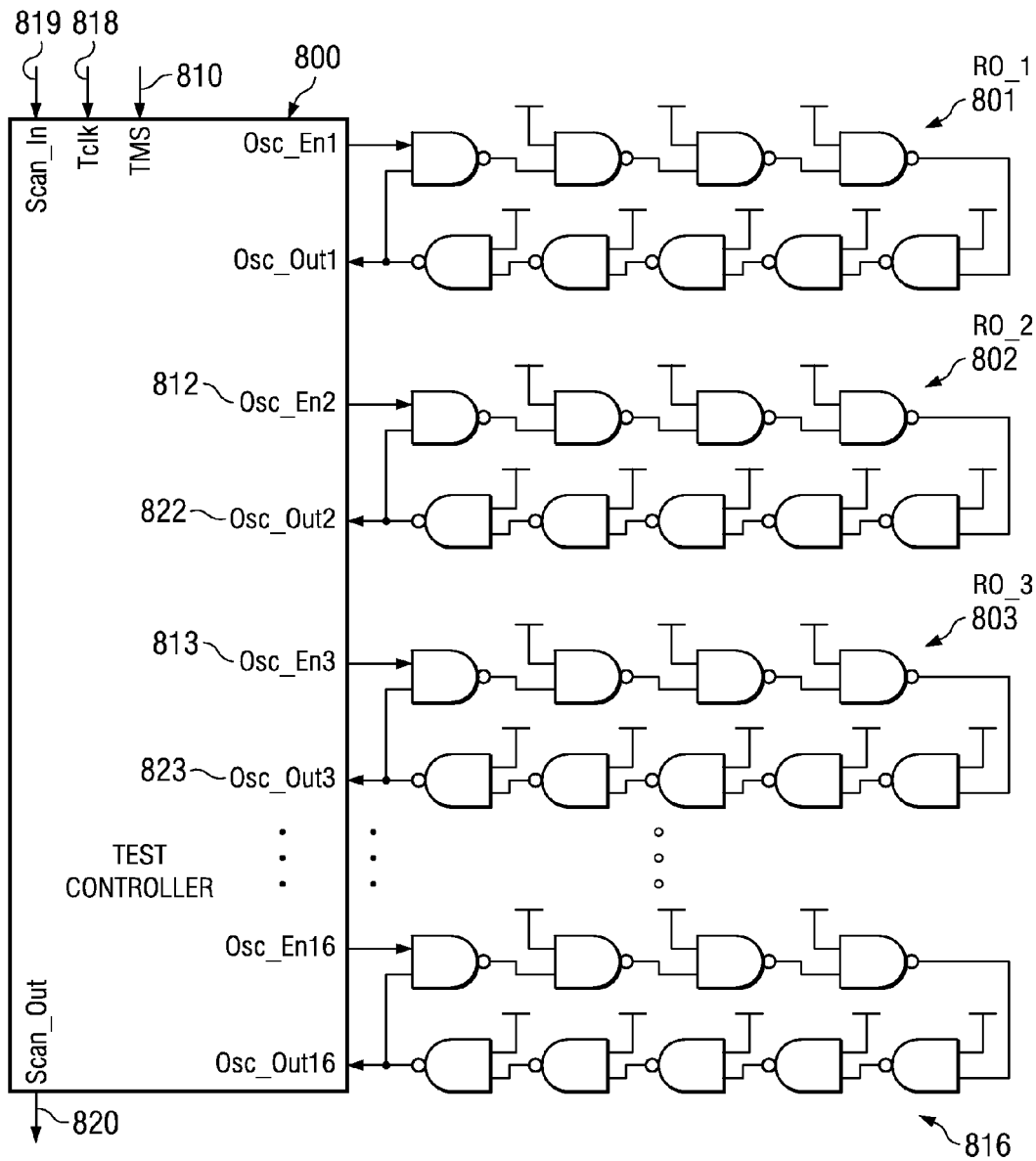
FIG. 9 illustrates the basic elements of a single set of ring oscillators connected to a test controller driven from JTAG boundary scan.

FIG. 9 illustrates the basic elements of a single set of ring oscillators connected to a test controller driven from JTAG boundary scan. Ring Oscillators 801, 802, 803 through 816 form a complete set with ROs between 803 and 816 understood but not shown. These ROs have the configuration described in conjunction with FIG. 3. Test controller 800 includes connections to the JTAG boundary scan for TMS 810, Tclk 818, Scan_In 819 and Scan_Out 820.

Figure 10:
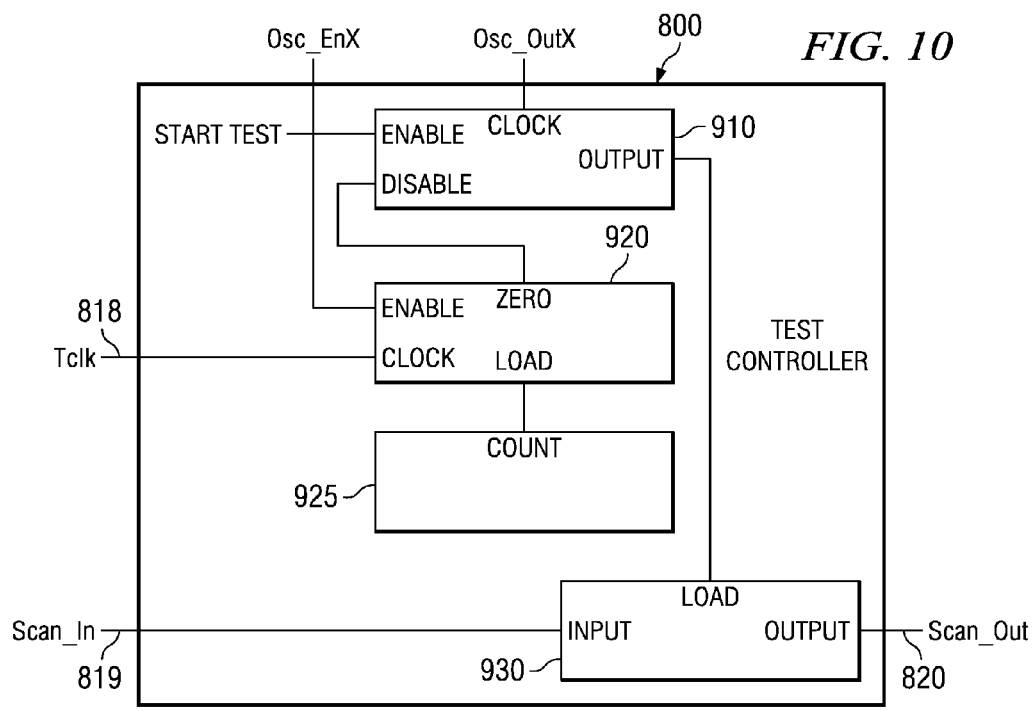
FIG. 10 illustrates a detail of the test controller illustrated in FIG. 9 showing the parts used to measure ring oscillator frequency.

FIG. 10 illustrates a detail of part of test controller 800 used to measure a RO frequency. One set of the circuits illustrated in FIG. 10 is provided within test controller 800 for each corresponding RO. Test controller 800 used two counters to measure RO frequency. Counter 910 is an up counter keeping track of RO output pulses. Counter 920 is a down counter that times the measurement period driven from Tclk. When the Start Test signal is enabled, the corresponding OSC_EnX signal (812 or 813 for example) is activated. The corresponding RO begins producing output pulses Osc_OutX (at 822 or 823). The Start Test signal also enables up counter 910 (initialized at zero) and down counter 920 (initialized from register 925). Register 925 may be a read only register storing a fixed value or a read/write register storing a count specified by a data processor. Time expires when down counter 920 counts down to zero. A zero output signal disables up counter 910. This zero output signal preferably also disables the corresponding RO (not shown). The count in up counter 910 is output to frequency count register 930. Frequency count register 930 thus stores a direct indication of the RO frequency. This frequency count value is output via the JTAG scan chain including Scan_In 819 and Scan_Out 820 for storage externally. Test controller 800 contains all required state machines and controls (not shown) to sequence through frequency measurements of all the ROs.

Figure 11:
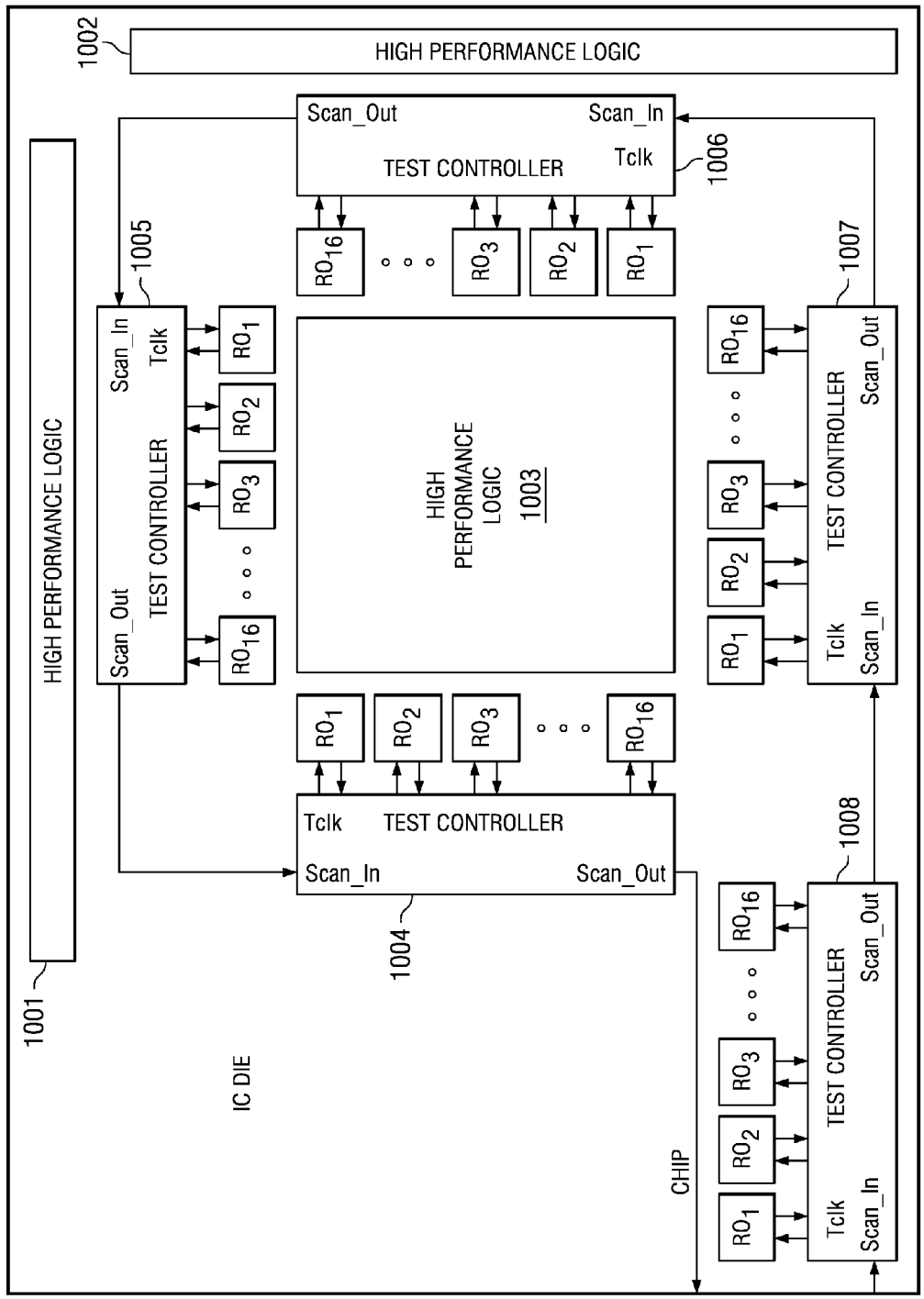
FIG. 11 illustrates the top level organization of the full complement of ring oscillators on a manufactured chip designed to achieve optimum accuracy of performance prediction.

FIG. 11 illustrates the top-level organization of the full complement of ring oscillators on a manufactured chip designed to achieve optimum accuracy for performance prediction. High performance logic to be modeled is contained in three modules 1001, 1002 and 1003. Test controllers and associated RO modules are shown in 1004, 1005, 1006, 1007 and 1008. The RO structures are placed adjacent to critical paths in the chip. This permits the ROs to form a better performance model of the chip critical paths. These locations are preferably dispersed liberally throughout the chip.

This invention has the following advantages. This invention improves accuracy.

This invention is more accurate than the prior art. This reduces the excess voltage and the resulting power that is supplied to provide margin for error in the prior art. This invention determines the exact critical path before manufacturing a chip. This is a challenging task. A technique using a replica critical path is correspondingly difficult. The present invention determines the model only after manufacturing is complete and uses data based on the real critical path.

This invention permits consideration of multiple critical paths. Different critical paths may become important under different operating conditions. The model of this invention supports differing critical paths using a piece-wise model or a higher order model.

This invention is reusable. Provided a wide enough range of ROs are used, the design can be reused in a variety of chips without individual customization.

What is claimed is:

1. A method for manufacturing a semiconductor chip comprising the steps of:
    placing a plurality of ring oscillators on the semiconductor chip during manufacture of the semiconductor chip including selecting ring oscillator types by the steps of:
        identifying individual unique critical paths for flow of signals on the semiconductor chip;
        identifying specific combinatorial logic circuits in each of the unique critical paths;
        selecting ring oscillator types that effectively model the identified specific combinatorial logic circuits;
    measuring individual oscillation frequencies of said ring oscillators; and
    determining a grade for the semiconductor chip dependent upon the measured ring oscillator frequencies.

2. The method of claim 1, wherein:
    said step of selecting ring oscillator types employs a least squares fitting of circuit delays of combinatorial logic circuits and ring oscillator type candidates.

3. The method of claim 2, wherein:
    said step of selecting ring oscillator types selects ring oscillator type candidates based upon rank in contribution to least squares fit and available area on the semiconductor chip.

4. The method of claim 2, wherein:
    said step of selecting ring oscillator types selects ring oscillator type candidates based upon rank in contribution to least squares fit greater than a predetermined threshold.

5. The method of claim 1, wherein:
    said step of measuring individual oscillation frequencies of said ring oscillators measures said ring oscillator frequencies at a plurality of operating conditions; and
    said step of determining a grade for the semiconductor chip employs said measures of said ring oscillator frequencies at said plurality of operating conditions.

6. The method of claim 5, wherein:
    said plurality of operating conditions includes a plurality of operating voltages.

7. The method of claim 5, wherein:
    said plurality of operating conditions includes a plurality of operating temperatures.

8. The method of claim 1, further comprising the step of:
    writing the determined grade for the semiconductor chip in a write-once memory included in the semiconductor chip.

9. A semiconductor chip comprising:
    a plurality of ring oscillators disposed at locations in proximity to critical paths on the semiconductor chip, said plurality of ring oscillators having ring oscillator types selected to model specific combinatorial logic circuits in said critical paths.

10. The semiconductor chip of claim 9, further comprising:
    at least one test controller, each of said plurality of ring oscillators connected to one test controller, each test controller operable to measure a frequency of operation of each connected ring oscillator and place data in a corresponding frequency count register indicative of said measured frequency, each frequency count register connected in a serial test.

11. The semiconductor chip of claim 9, further comprising:
    a write-once memory circuit, said write-once memory written during manufacture to store a minimum voltage of operation for said semiconductor chip.

\* \* \* \* \*